(12) United States Patent
Chen et al.

(10) Patent No.: US 9,831,882 B1
(45) Date of Patent: Nov. 28, 2017

(54) FAST-RESPONSE HYBRID LOCK DETECTOR

(71) Applicant: Integrated Device Technology, Inc., San Jose, CA (US)

(72) Inventors: Xinqing Chen, Shanghai (CN); HaiQi Liu, Shanghai (CN); Yuan Zhang, Shanghai (CN)

(73) Assignee: INTEGRATED DEVICE TECHNOLOGY, INC., San Jose, CA (US)

( * ) Notice: Subject to any disclaimer, the term of this patent is extended or adjusted under 35 U.S.C. 154(b) by 0 days.

(21) Appl. No.: 15/226,286

(22) Filed: Aug. 2, 2016

(30) Foreign Application Priority Data

Jul. 5, 2016 (CN) .......................... 2016 1 0519736

(51) Int. Cl.
*H03L 7/06* (2006.01)
*H03L 7/095* (2006.01)
*H03L 7/089* (2006.01)

(52) U.S. Cl.
CPC ............ *H03L 7/095* (2013.01); *H03L 7/0891* (2013.01)

(58) Field of Classification Search
CPC ......... H03L 7/093; H03L 7/18; H03L 7/0891; H03L 7/085; H03L 7/0995
See application file for complete search history.

(56) References Cited

U.S. PATENT DOCUMENTS

| 6,483,361 | B1 * | 11/2002 | Chiu ...................... H03L 7/0891 327/157 |
| 2010/0271092 | A1 * | 10/2010 | Zerbe .................. G06F 13/4243 327/161 |

* cited by examiner

*Primary Examiner* — Sibin Chen
(74) *Attorney, Agent, or Firm* — Christopher P. Maiorana, PC

(57) ABSTRACT

The invention concerns an apparatus comprising an analog circuit and a digital circuit. The analog circuit may be configured to generate an enable signal in response to (i) a comparison of a width of an up pulse and a pre-determined width and (ii) a comparison of a width of a down pulse and the pre-determined width. The up pulse and the down pulse may be generated in response to a comparison of a feedback signal and a reference signal. The enable signal may be active when both the comparisons are within a pre-determined threshold. The digital circuit may be configured to generate an output signal representing a lock status between (i) the feedback signal and (ii) the reference signal. The lock status may be determined (a) during a decision window based on a number of pulses of the reference signal and (b) when the enable signal is active.

19 Claims, 8 Drawing Sheets

FAST-RESPONSE HYBRID LOCK DETECTOR

This application relates to Chinese Application No. 201610519736.9, filed Jul. 5, 2016, which is hereby incorporated by reference in its entirety.

FIELD OF THE INVENTION

The invention relates to clock generation generally and, more particularly, to a method and/or apparatus for implementing a fast-response hybrid lock detector.

BACKGROUND

Conventional counter-based lock detectors function by comparing a reference clock and voltage-controlled oscillator (VCO) feedback clock within a specified period of time according to a locking accuracy specification. Conventional lock detectors usually need to count thousands of clock cycles to achieve the locking accuracy. However, during the initial process of phase locking for a phase-locked loop (PLL), the VCO frequency can be much higher or lower than the reference frequency. A difference between the VCO frequency and the reference frequency can produce an unlock signal even if the PLL is already in lock at the end of a first lock detection window. A second lock detection window needs to be started and additional thousands of clock cycles are wasted for comparison. Even if the first detection window succeeds to produce a correct output, the PLL still needs a long time for the specified accuracy. In many applications, such as in a memory interface, only a few hundred clock cycles are allowed to be used for lock detection.

It would be desirable to implement a fast-response hybrid lock detector.

SUMMARY

The invention concerns an apparatus comprising an analog circuit and a digital circuit. The analog circuit may be configured to generate an enable signal in response to (i) a comparison of a width of an up pulse and a pre-determined width and (ii) a comparison of a width of a down pulse and the pre-determined width. The up pulse and the down pulse may be generated in response to a comparison of a feedback signal and a reference signal. The enable signal may be active when both the comparisons are within a pre-determined threshold. The digital circuit may be configured to generate an output signal representing a lock status between (i) the feedback signal and (ii) the reference signal. The lock status may be determined (a) during a decision window based on a number of pulses of the reference signal and (b) when the enable signal is active.

BRIEF DESCRIPTION OF THE FIGURES

Embodiments of the invention will be apparent from the following detailed description and the appended claims and drawings in which:

DETAILED DESCRIPTION OF THE EMBODIMENTS

Embodiments of the present invention include providing a hybrid lock detector that may (i) provide a fast response, (ii) be used in a PLL, (iii) implement a hybrid lock detector (HLD) that may combine an analog phase comparator and digital lock detector, (iv) achieve fast lock detection without sacrificing locking detection accuracy and/or (v) be implemented as one or more integrated circuits.

Figure 1:
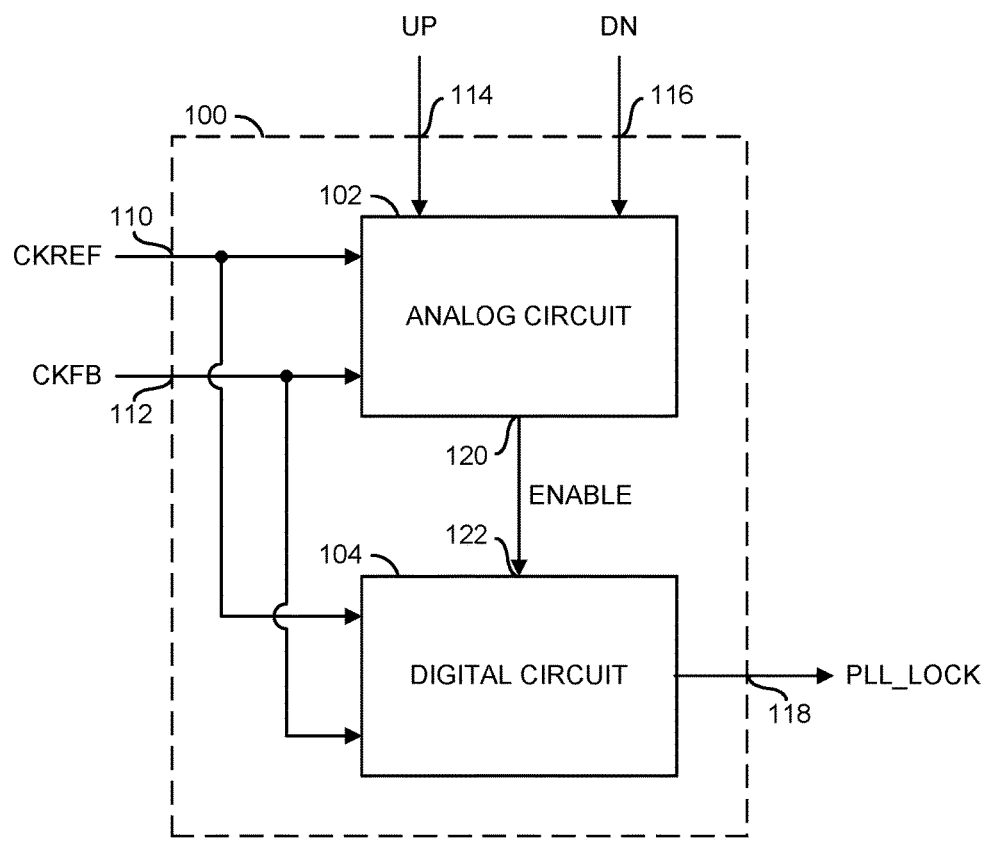
FIG. 1 is a diagram of an example embodiment of the invention.

Referring to FIG. 1, a block diagram of a circuit 100 is shown in accordance with an embodiment of the invention. The circuit 100 may be implemented as a fast response hybrid lock detector that may be used with a phase-locked loop (PLL) circuit. The circuit 100 generally comprises a block (or circuit) 102 and a block (or circuit) 104. The circuit 102 may be implemented as an analog circuit. In an example, the analog circuit 102 may implement a phase comparator circuit. The circuit 104 may be implemented as a digital circuit. In an example, the digital circuit 104 may implement a lock detector circuit. The circuit 100 may have an input 110, an input 112, an input 114, an input 116 and an output 118.

The input 110 may receive a signal (e.g., CKREF). The input 112 may receive a signal (e.g., CKFB). The input 114 may receive a signal (e.g., UP). The signal UP may be a pulse. The input 116 may receive a signal (e.g., DN). The signal DN may be a pulse. The output 118 may present a signal (e.g., PLL_LOCK). The circuit 102 may have an output 120 that may present a signal (e.g., ENABLE). The circuit 104 may have an input 122 that may receive the signal ENABLE. The circuit 102 may generate the signal ENABLE in response to the signal CKREF, the signal CKFB, the signal UP, and/or the signal DN. The circuit 104 may generate the signal PLL_LOCK in response to the signal CKREF, the signal CKFB, and/or the signal ENABLE.

In some embodiments, the circuit 100 may be implemented as part of a memory module. In an example, the circuit 100 may be a component used to implement a double data rate (e.g., DDR) memory module. For example, the circuit 100 may be a component used in DDR2, DDR3 and/or DDR4 memory. The type of memory implementing the circuit 100 may be varied according to the design criteria of a particular implementation.

Figure 2:
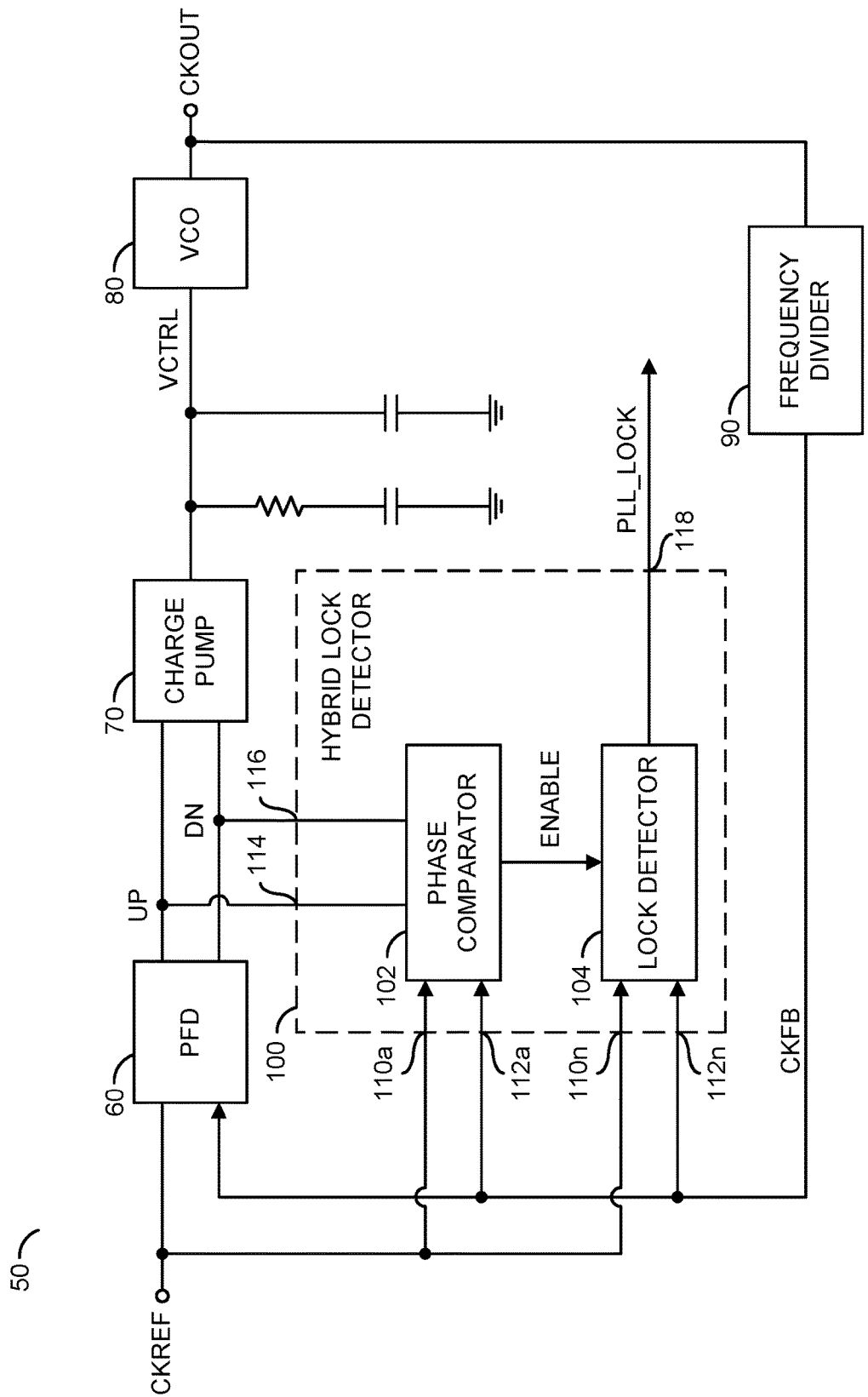
FIG. 2 is a diagram of the lock detector in a context of a PLL circuit.

Referring to FIG. 2, a block diagram of a circuit 50 is shown in accordance with an embodiment of the invention. The circuit 50 may implement a phase locked loop (PLL) circuit. The circuit 50 generally comprises a block (or circuit) 60, a block (or circuit) 70, a block (or circuit) 80, a block (or circuit) 90 and/or the circuit 100. The circuit 60 may be implemented as a phase frequency detector (PFD). The circuit 70 may be implemented as a charge pump. The circuit 80 may be implemented as a voltage-controlled oscillator (VCO). The circuit 90 may be implemented as a frequency divider. The circuit 60 may generate the signal UP and the signal DN in response to the signal CKREF and/or the signal CKFB.

The circuit 50 may receive the signal CKREF as an input. The PFD 60 may compare the frequency of the reference signal CKREF and the frequency of the feedback signal CKFB. The PFD 60 may generate the signal UP and the signal DN in response to the comparison. The PFD 60 may generate the signal UP when the frequency of the feedback signal CKFB is lower than the frequency of the reference signal CKREF. The PFD 60 may generate the signal DN when the frequency of the feedback signal CKFB is higher than the frequency of the reference signal CKREF. The charge pump 70 and/or the circuit 100 may receive the signal UP and the signal DN. The VCO 80 may receive a signal (e.g., VCTRL). The signal VCTRL may be an output from the charge pump 70 with a low pass filter. The signal CKOUT may be generated by the VCO 80. The signal CKOUT may be an output of the circuit 50. The signal CKOUT may be an input of the frequency divider 90. The frequency divider 90 may generate the signal CKFB. The signal PLL_LOCK may be an output of the circuit 50.

During an initial lock in stage, the phase comparator 102 may compare the pulse UP and the pulse DN received from the PFD circuit 60. The phase comparator 102 may determine whether the widths of pulses UP and DN are close to each other. Once the frequency of the signal CKFB (e.g., based on the signal CKOUT) is close to the frequency of the signal CKREF (e.g., the reference frequency), the pulses UP and DN normally have a similar and/or narrow width (to be described in more detail in connection with FIGS. 7 and 8). The phase comparator 102 may then produce the signal ENABLE. The signal ENABLE may initiate (e.g., kick start) the lock detector circuit 104. The lock detector circuit 104 may implement a counter-based frequency detection. The counter-based frequency detection may directly count the pulses on the signal CKREF and/or the signal CKFB. The counter-based frequency detection may be implemented to determine a lock status.

Figure 3:
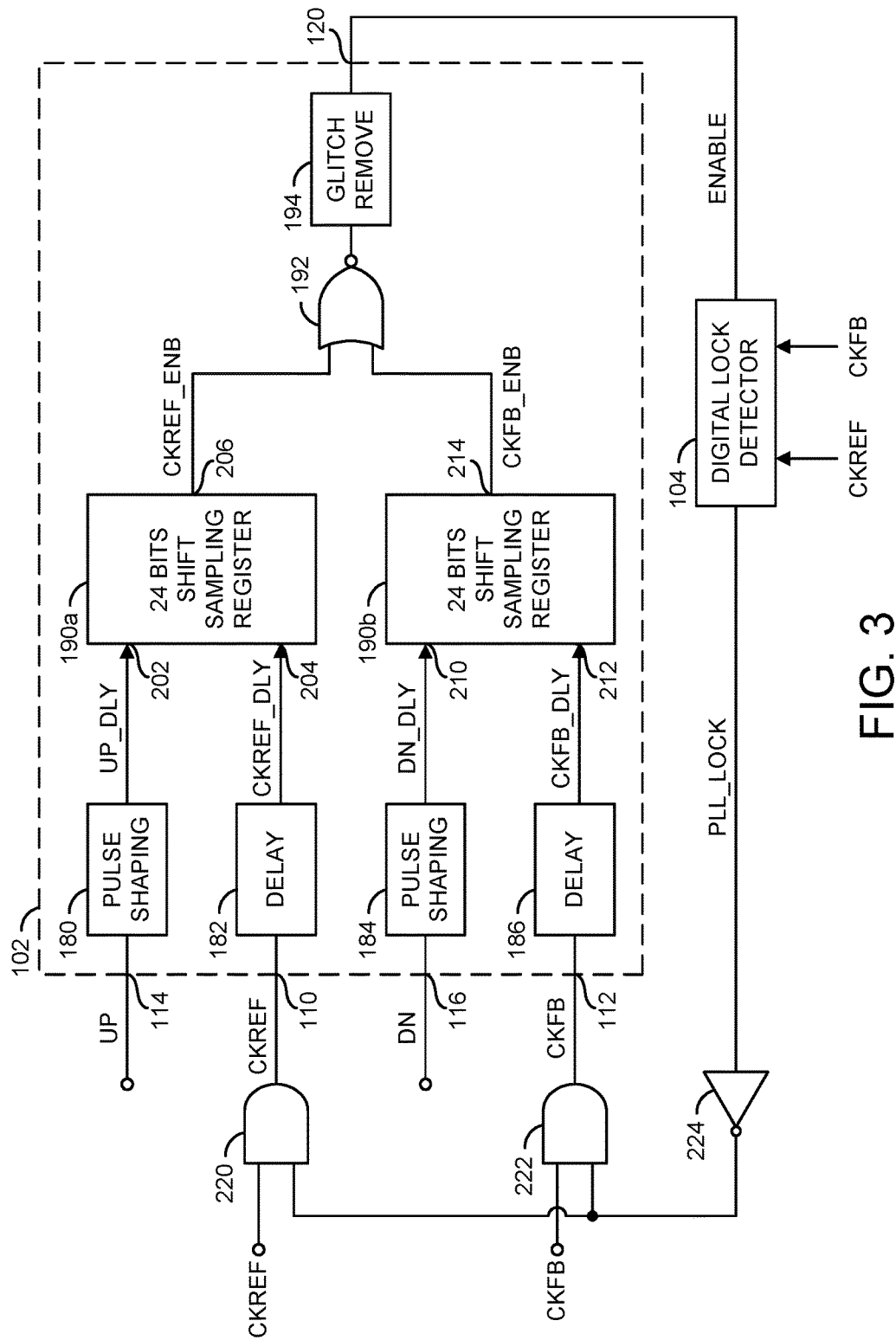
FIG. 3 is a diagram of the analog circuit of FIG. 1.

Referring to FIG. 3, a block diagram illustrating details of the phase comparator circuit 102 is shown. The phase comparator circuit 102 generally comprises a block (or circuit) 180, a block (or circuit) 182, a block (or circuit) 184, a block (or circuit) 186, a block (or circuit) 190a, a block (or circuit) 190b, a logic gate 192 and a block (or circuit) 194. The circuit 180 may be implemented as a pulse shaping circuit. The circuit 182 may be implemented as a delay circuit. The circuit 184 may be implemented as a pulse shaping circuit. The circuit 186 may be implemented as a delay circuit. The circuit 180 may present a signal (e.g., UP_DLY) in response to the signal UP. The signal (or pulse) UP_DLY may be a delayed version of the pulse UP. The circuit 182 may generate a signal (e.g., CKREF_DLY) in response to the signal CKREF. The circuit 184 may generate a signal (e.g., DN_DLY) in response to the signal DN. The signal (or pulse) DN_DLY may be a delayed version of the pulse DN. The circuit 186 may generate a signal (e.g., CKFB_DLY) in response to the signal CKFB. The signal (or pulse) CKREF_DLY may be a delayed reference clock signal. The signal CKFB_DLY may be a delayed feedback clock signal.

The circuit 190a may have an input 202 that may receive the signal UP_DLY, an input 204 that may receive the signal CKREF_DLY and an output 206 that may present a signal (e.g., CKREF_ENB). Similarly, the circuit 190b may have an input 210 that may receive the signal DN_DLY, an input 212 that may receive the signal CKFB_DLY, and an output 214 that may present a signal (e.g., CKFB_ENB).

The circuits 190a-190b may be implemented as shift sampling registers. The shift sampling registers 190a-190b may be implemented to sample a pre-determined threshold (number) of consecutive logical values (e.g., zeros) to determine whether the signal UP and the signal DN are aligned for the pre-determined number of clock cycles. In some embodiments, the pre-determined threshold may be a determination of a consecutive number of logical values (e.g., consecutive '0's or consecutive '1's) corresponding to a width of the pulse UP and/or the pulse DN (e.g., signals based on a comparison of the reference signal CKREF and the feedback signal CKFB).

In an example, the shift sampling registers may be 24 bit shift sampling registers. The 24 bit shift sampling registers 190a-190b may be configured to sample 16 consecutive zeros. In another example, the shift sampling registers may be 32 bit shift sampling registers. Adjusting the size of the shift sampling registers 190a-190b may determine the number of consecutive zeros detected. Increasing a size of the shift sampling registers 190a-190b may increase an accuracy of the phase locking status and increase a die area of the circuit 100. A statistical analysis may be performed to determine the size of the shift sampling registers 190a-190b. The size of the shift sampling registers 190a-190b may be varied according to the design criteria of a particular implementation.

In the example shown, the logic gate 192 may be implemented as a 'NOR' gate that may present a logical high value to the circuit 194 when both the signal CKREF_ENB and the signal CKFB_ENB have a logical low value. Other types of logic gates and/or combinations of logic gates may be implemented between the shift sampling registers 190a-190b and the circuit 194. In some embodiments, the logic gate 192 may be implemented as an 'OR' gate that may present a logical high value when either signal CKREF_ENB, or the signal CKFB_ENB have a logical low value (e.g., the signal ENABLE may be equivalent to a disable signal where a logical high value may disable the circuit 104 and a logical low value may enable the circuit 104). The circuit 194 may be a glitch remove circuit. The circuit 194 may generate the signal ENABLE in response to either the signal CKREF_ENB and/or the signal CKFB_ENB.

The pulse shaping circuit 180 (or 184) may be configured to compare a width of the pulses UP and/or DN with a pre-determined width. In an example, the pulse shaping circuit 180 may perform a first comparison between the pulse UP and the pre-determined width. In another example, the pulse shaping circuit 184 may perform a second comparison between the pulse DN and the pre-determined width. The pulse shaping circuit 180 (or 184) may filter out the pulses UP and/or DN that are narrower than a specified (or pre-determined) width (e.g., 400 ps in one example).

In an example, during the lock-in stage, when a large difference is detected between the frequency of the reference signal CKREF and the frequency of the feedback signal CKFB, either the pulse UP or the pulse DN may be wider than the specified width. The corresponding delayed clock signal CKREF_DLY and/or the delayed feedback clock signal CKFB_DLY may sample the delayed pulse UP_DLY and/or DN_DLY, respectively. When the pulse UP is wider than the specified width, the shift register 190a produces an output (e.g., a logical '1') at the output 206 on the signal CKREF_ENB. Similarly, when the pulse DN is wider than the specified width, the shift register 190b produces an output (e.g., a logical '1') at the output 214 on the signal CKFB_ENB. The logic gate 192 may not activate the signal ENABLE in response to the logical high value of the output 206 and/or the logical high value of the output 214.

When the VCO feedback frequency signal CKFB is close to the frequency of the reference signal CKREF, the pulses UP and/or DN become narrower than the specified width. The narrow pulses UP and/or DN may be removed by the pulse shaping circuit 180 and/or 184. Removing the narrow pulses may result in a sampling of a logical value of '0' in the sampling register circuit 190a and/or 190b. When a pre-determined number of consecutive '0's are sampled, the signal CKREF_ENB and CKFB_ENB may transition low (e.g., a logical '0' value). In an example, the pre-determined number of consecutive '0's may be 16. When both of the signals CKREF_ENB and CKFB_ENB transition low, the circuit 50 may almost be in a lock. The signal ENABLE may be generated by the circuit 194. The digital lock detector 104 may then be enabled in response to the signal ENABLE to finalize the frequency detection.

A logic gate 220 is shown at the input 110. A logic gate 222 is shown at the input 112. In the example shown, the logic gates 220 and 222 may implement 'AND' gates. The digital lock detector circuit 104 may generate the signal PLL_LOCK in response to a detected phase lock. The signal PLL_LOCK may represent a lock status between the feedback signal CKFB and the reference signal CKREF. A logic gate 224 is shown receiving the signal PLL_LOCK. In the example shown, the logic gate 224 may implement an inverter circuit. The type of logic gates 220, 222 and 224 implemented may be varied according to the design criteria of a particular implementation. Generally, the logic gates 220, 222 and 224 may be configured to disable the phase comparator 102 when the signal PLL_LOCK is active. In an example, the circuit 100 may be in a self-lock state until a reset signal is asserted. The self-lock state may reduce a power consumption of the circuit 100 after a PLL lock.

Figure 4:
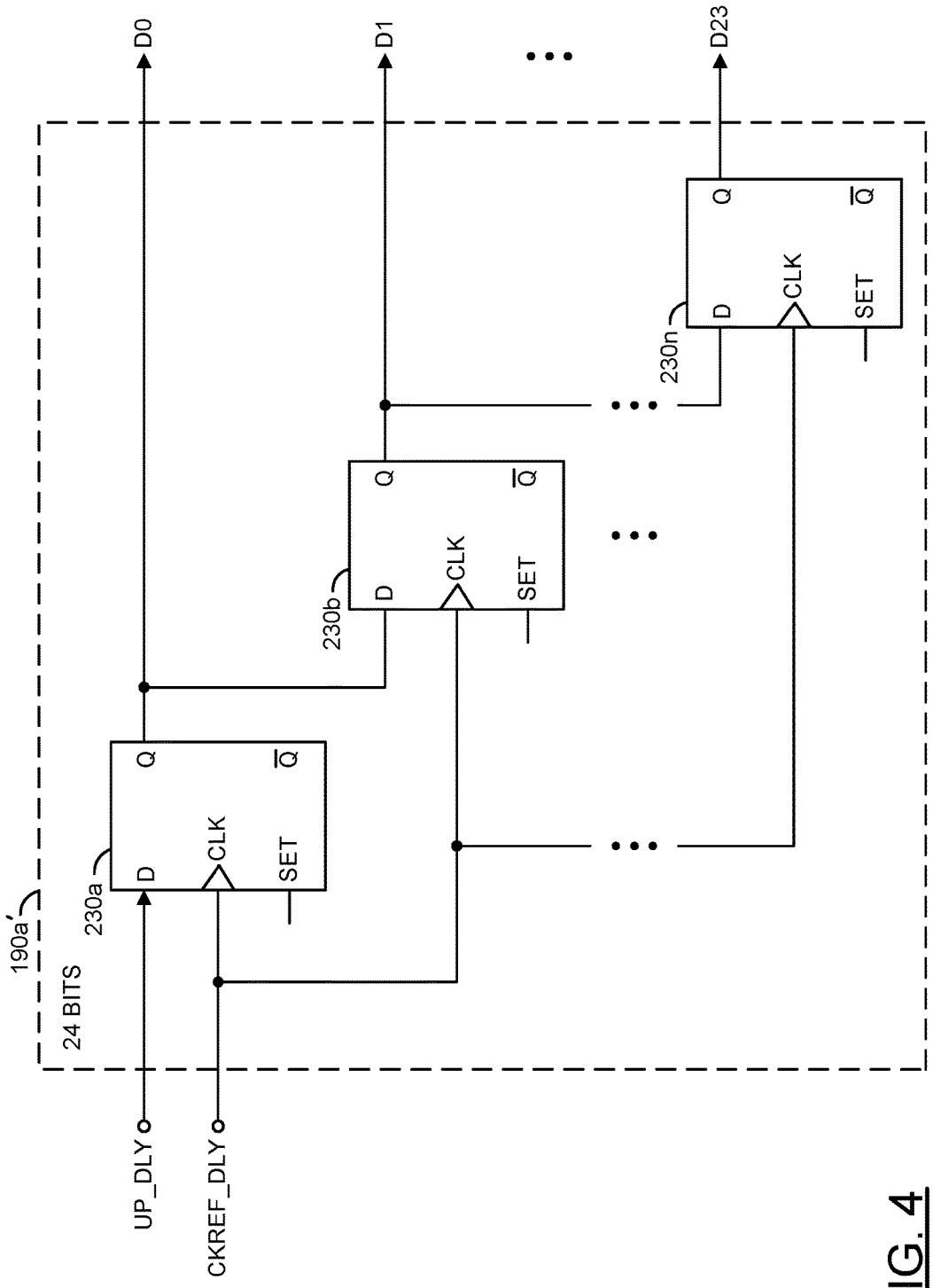
FIG. 4 is a diagram illustrating details of the shift sampling resistor.

Referring to FIG. 4, a block diagram illustrating details of the shift sampling register 190a' is shown. The shift sampling register 190a' may be a representative example of the shift sampling registers 190a-190b described in association with FIG. 3. A number of registers 230a-230n are shown. In the example implementation shown, 24 registers 230a-230n are shown. In some embodiments, each of the registers 230a-230n may be implemented as a D Flip-Flop (DFF). However, the particular number and/or type of registers implemented may be varied to meet the design criteria of a particular implementation.

In an example embodiment implementing 24 of the registers 230a-230n, the first 8 stages (e.g., 230a-230h) of the 24-bit shift sampling register 190a' may be used to remove meta-stability. In an example, by removing meta-stability, the signal UP_DLY and/or DN_DLY may settle to a logic level (e.g., '0' or '1') within an amount of time needed for operation of the circuit 100 (e.g., the number of clock cycles allowed to be used for lock detection for a memory interface in a memory specification such as a DDR4 SDRAM specification). The latter 16 stages (shown in more detail in FIG. 5) may be used to determine that consecutive 16 '0's have been sampled. The register 190a' is shown receiving the signal UP_DLY and the signal CKREF_DLY. Each of the registers 230a-230n may present an output (e.g., D0-D23). The circuit 230a may receive the signal UP_DLY as an input. The output D0 from the circuit 230a may be presented to the input of the circuit 230b (e.g., instead of the signal UP_DLY). Similarly, the outputs (e.g., D0-D22) from the circuits 230a-230m may be used as inputs for the next one of the circuits 230b-230n. For example, the circuits 230a-230n may be connected in series. The shift register 190b may have a similar implementation. The shift register 190b may receive the signal DN_DLY and the signal CKFB_DLY. The internal registers 230a-230n would have a similar implementation on the register 190a and the register 190b.

Figure 5:
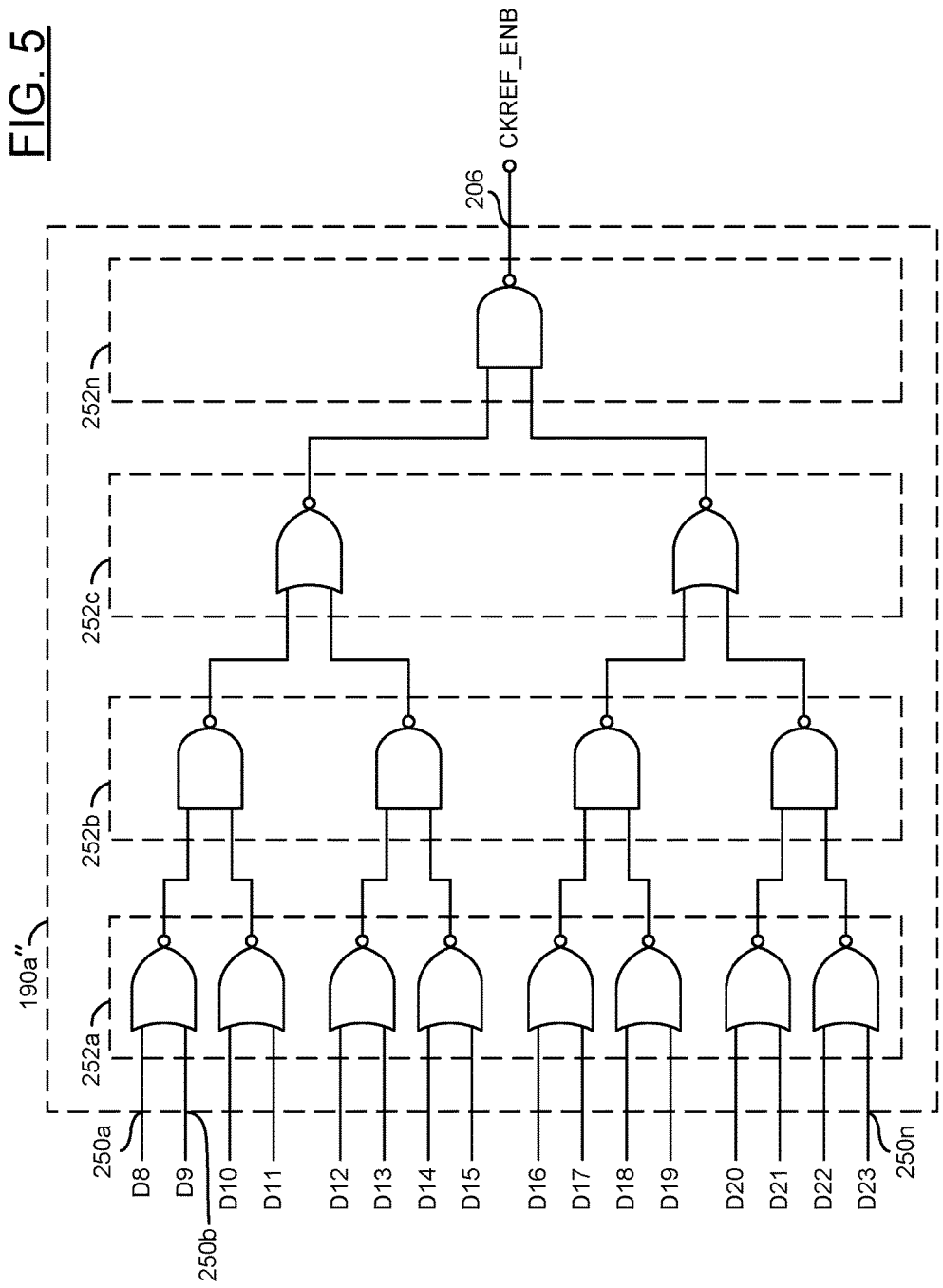
FIG. 5 is a diagram illustrating logic for detecting a number of consecutive zeros.

Referring to FIG. 5, a block diagram illustrating logic 190a" for detecting consecutive zeros is shown. The shift sampling register 190a" may be a representative example of the shift sampling registers 190a-190b described in association with FIG. 3. The circuit 190a" is shown with a number of inputs 250a-250n. The bits D8-D23 generated by the registers 230a-230n may be presented to the inputs 250a-250n. In an example, the input 250a may receive the bit D8. In another example, the input 250b may receive the bit D9. In yet another example, the input 250n may receive the bit D23. The shift sampling register 190a" may have the output 206. The output 206 may present the signal CKREF_ENB in response to the inputs 250a-250n. Similarly, for the shift sampling register 190b", the output 214 may present the signal CKFB_ENB in response to the inputs 250a-250n.

The circuit 190a" may comprise logic stages 252a-252n. The number of logic stages 252a-252n may vary based on the number of the inputs 250a-250n. In the example shown, the first logic stage 252a may comprise 'NOR' gates, the second logic stage 252b may comprise 'NAND' gates, the third logic stage 252c may comprise 'NOR' gates and the last logic stage 252n may comprise a 'NAND' gate. The types of logic gates implemented in the logic stages 252a-252n may be varied according to the design criteria of a particular implementation. The logic stages 252a-252n may be configured to generate the signal CKREF_ENB in response to the inputs 250a-250n being a logical value of '0'.

Figure 6:
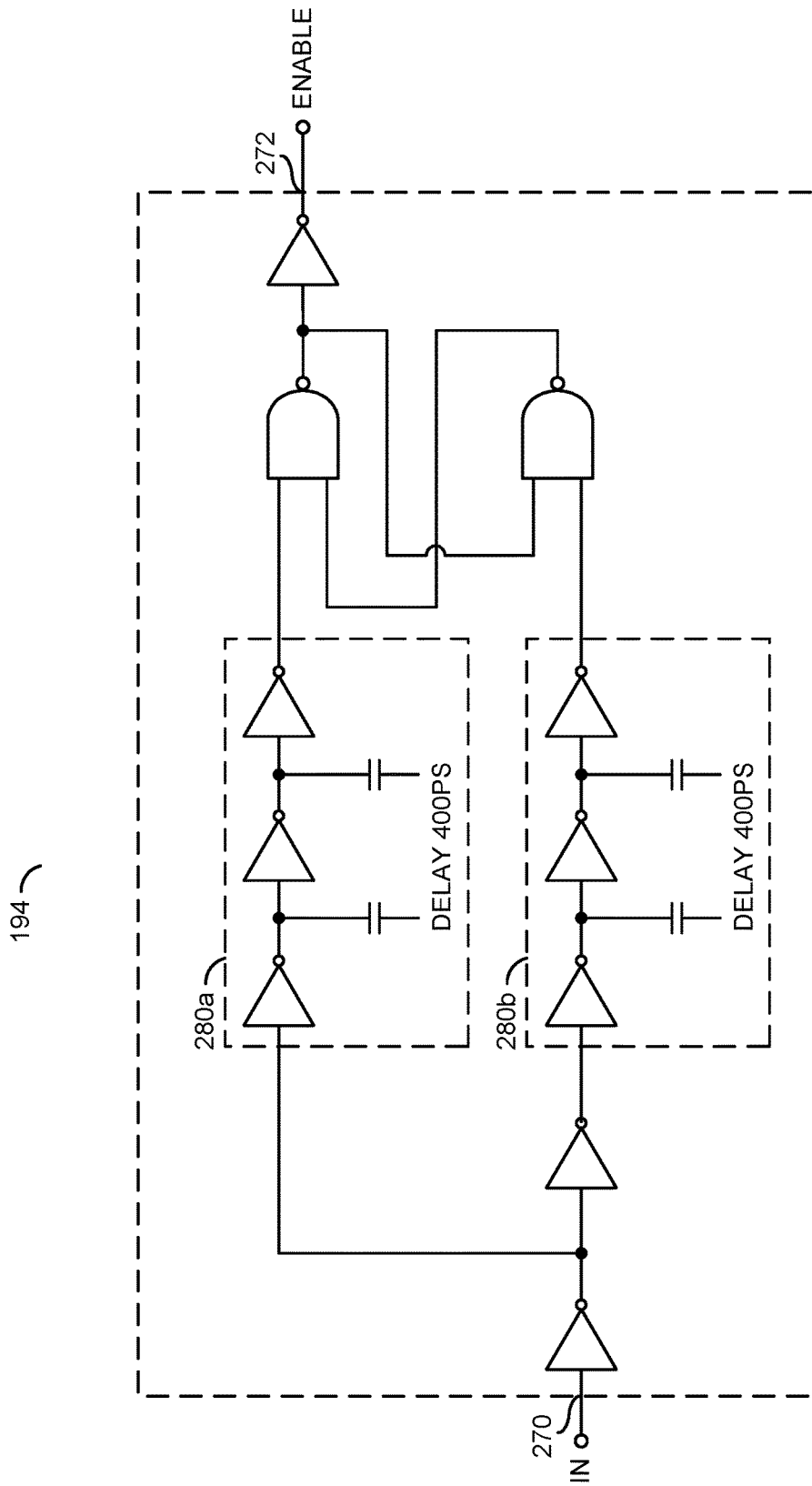
FIG. 6 is a diagram of a glitch removal circuit.

Referring to FIG. 6, a block diagram of a glitch removal circuit 194 is shown. The glitch removal circuit 194 may be added after the logic gate 192 to remove potential glitches. The glitch removal circuit may have an input 270 and an output 272. The input 270 may receive a signal (e.g., IN) generated by the logic gate 192. The output 272 may present the signal ENABLE.

The glitch removal circuit 194 may comprise various digital logic. The digital logic in the circuit 194 may be configured to ensure that pulses of the signal UP and/or the signal DN that are greater than the pre-determined width (e.g., 400 ps) are kept. The digital logic in the circuit 194 may be configured to ensure that pulses of the signal UP and/or the signal DN that are less than the pre-determined width (e.g., 400 ps) are filtered out. The digital logic in the circuit 194 may comprise blocks (or circuits) 280a-280b. The circuits 280a-280b may be delay circuits configured to generate a delay amount that approximates the pre-determined width. In the example shown, the delay circuits 280a-280b each comprise invertors and capacitors. In the example shown, the circuits 280a-280b generate a delay of 400 ps. The amount of the delay may be varied according to the design criteria of a particular implementation.

Figure 7:
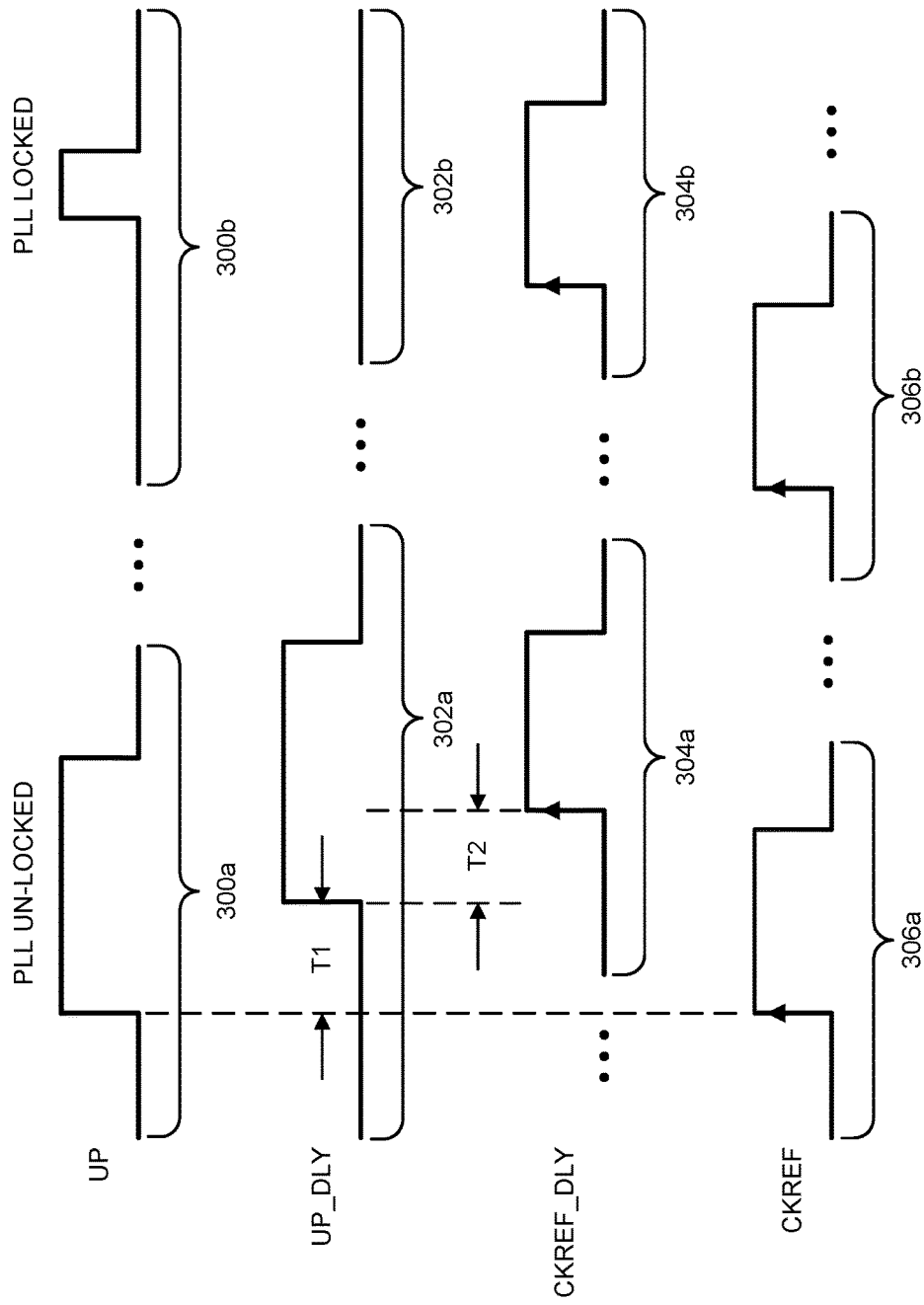
FIG. 7 is a timing diagram illustrating an almost locked condition.

Referring to FIG. 7, a block diagram illustrating an almost locked condition is shown. The sampling of the signal DN may be similar to the sampling shown of the signal UP. An example portion (pulse) 300a of the signal UP is shown. The portion 300a may represent an example of an unlocked version of the signal UP. An example of a portion (pulse) 302a of the signal UP_DLY is shown. The portion 302a may represent an example of an unlocked version of the signal UP_DLY. An example portion (pulse) 304a of the signal CKREF_DLY is shown. The portion 304a may represent the signal CKREF_DLY during an unlocked status. An example portion (pulse) 306a of the signal CKREF is shown. The portion 306a may represent the signal CKREF during an unlocked status.

An example portion (pulse) 300b of the signal UP is shown. The portion 300b may represent an example of an almost locked (or locked) version of the signal UP. An example portion (pulse) 302b of the signal UP_DLY is shown. The portion 302b may represent an example of an almost locked (or locked) version of the signal UP_DLY. An example portion (pulse) 304b of the signal CKREF_DLY is shown. The portion 304b may represent the signal CKREF_DLY during an almost locked and/or locked status. An example portion (pulse) 306b of the signal CKREF is shown. The portion 306b may represent the signal CKREF during the almost locked and/or locked status.

The signal UP_DLY may be a version of the signal UP after passing through the pulse shaping circuit 180 (e.g., delayed or filtered out). For example, the filtering by the circuit 180 (or 184) may determine the logical value for the signal UP (or DN). The signal CKREF_DLY may be a delayed version of the signal CKREF after passing through the delay circuit 182. The signal UP_DLY may be sampled by the shift sampling register 190a when the signal CKREF_DLY is a logical high value.

During the locking process, the signal UP_DLY may be either '0' or have a pulse width of greater than the pre-determined width (e.g., a time of 400 ps). A setup time (e.g., T2) may be fixed at a value (e.g., 220 ps). A hold time may be no less than the difference between the pre-determined time and the setup time (e.g., 180 ps).

The width of the pulse 300a of the signal UP may be greater than the pre-determined width when sampled by the portion 304a of the signal CKREF_DLY. The pulse 300a of the signal UP may be considered unlocked when the width of the pulse 300a is greater than the pre-determined width. The pulse shaping circuit 180 may not filter out the pulse 300a of the signal UP (e.g., no '0' value may be detected by the circuit 190a). The pulse 302a of the signal UP_DLY is shown as a delayed version of the pulse 300a of the signal UP. The width of the pulse 300b of the signal UP may be less than the pre-determined width when sampled by the portion 304b of the signal CKREF_DLY. The pulse shaping circuit 180 may filter out the pulse 300b of the signal UP (e.g., a '0' value may be detected by the circuit 190a). The pulse 302b of the signal UP_DLY is shown as a filtered version of the pulse 300b of the signal UP. The pulse 302b of the signal UP_DLY is shown having a logical low (e.g., zero) value.

The phase comparator 102 may compare the pulses of the signal UP and the signal DN based on respective widths of the pulse UP and the pulse DN. When the lock status of the circuit 100 is close to a phase lock, the widths of the pulse UP and the pulse DN may become narrower. In an example, the pulse UP and the pulse DN may narrow to a similar width. To determine a lock status of the circuit 100, the width of the pulse UP may be compared to the pre-determined width and the width of the pulse DN may be compared to the pre-determined width. The pre-determined width may be based on a reset path of the PFD circuit 60. The lock status may be determined when the signal ENABLE is active.

The pulse shaping circuit 180 may be configured to filter out the signal UP when the width of the pulse UP is smaller than the pre-determined width (e.g., the portion 302b of the signal UP_DLY). Similarly, the pulse shaping circuit 184 may be configured to filter out the signal DN when the width of the pulse DN is smaller than the pre-determined width. When both the logical values of the filtered signal UP have been the same within a pre-determined threshold (e.g., 16 consecutive logical low values) and the logical values of the filtered signal DN have been the same within a pre-determined threshold (e.g., 16 consecutive logical low values) the signal ENABLE may be generated. In an example, when the pulse UP is narrow (e.g., less than the pre-determined width) and the pulse DN is wide (e.g., larger than the pre-determined width), the lock status of the circuit 100 may not be locked. In another example, the signal ENABLE may be generated in response to a sampling of 16 consecutive '0's of the signal UP by the shift sampling register 190a and a sampling of 16 consecutive '0's of the signal DN by the shift sampling register 190b.

Figure 8:
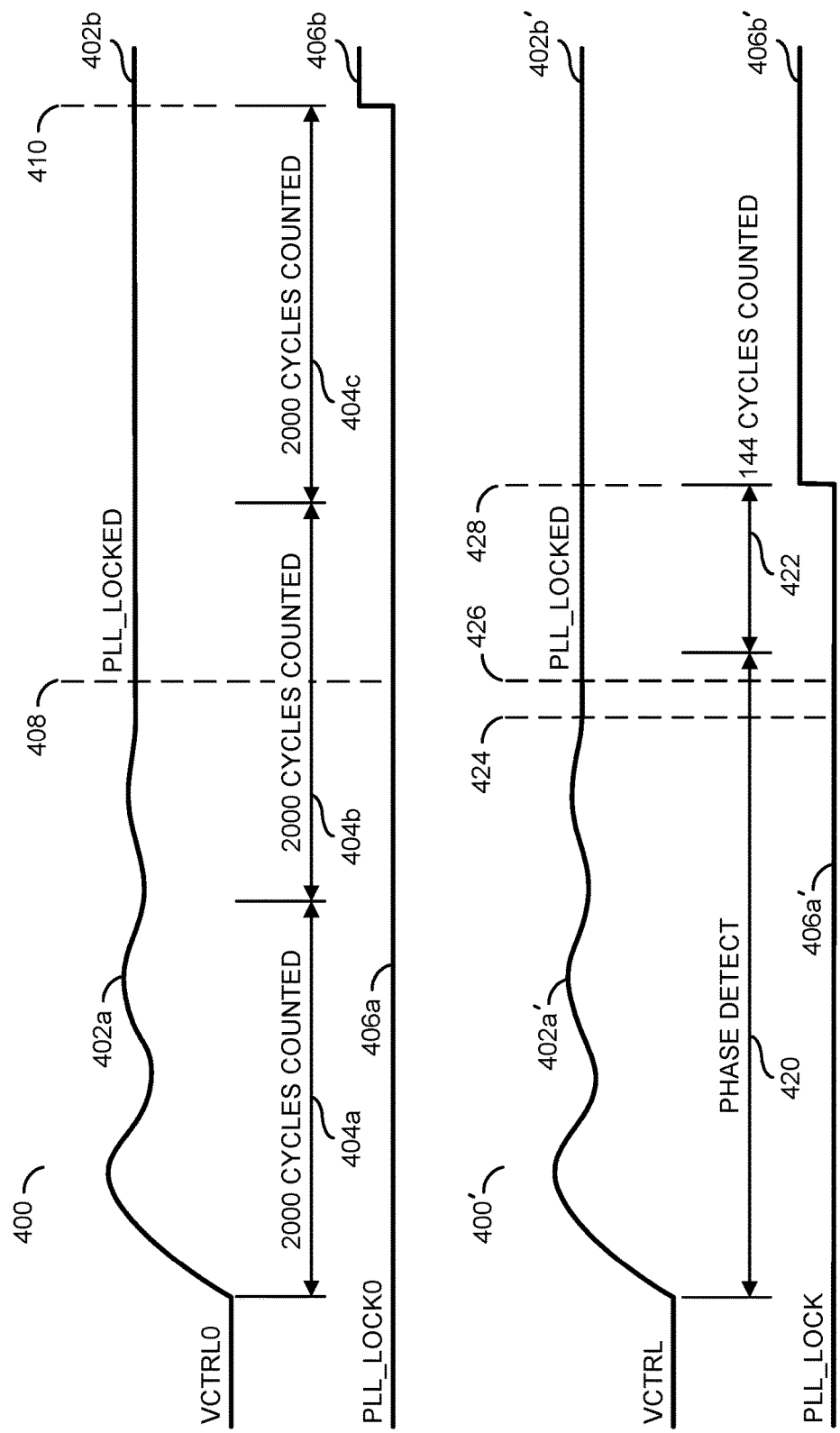
FIG. 8 is a timing diagram illustrating the generation of a lock signal.

Referring to FIG. 8, a timing diagram illustrating the generation of the signal PLL_LOCK is shown in accordance with an embodiment of the invention. A timing diagram 400 is shown without implementing the circuit 100. A timing diagram 400' is shown when the circuit 100 is implemented.

In the timing diagram 400, a portion 402a and a portion 402b of a signal (e.g., VCTRL0) are shown, (decision) windows 404a-404c are shown, and a portion 406a and a portion 406b of a signal (e.g., PLL_LOCK0) are shown. The portions 402a-402b may represent a phase locking. A line 408 is shown. The line 408 may represent a time when the signal VCTRL0 is locked (e.g., PLL_LOCKED). The portion 402a of the signal VCTRL0 shown before the time 408 may be unlocked. The portion 402b of the signal VCTRL0 shown after the time 408 may be locked. A line 410 is shown. The line 410 may represent a time when the signal PLL_LOCK0 is enabled. The portion 406a of the signal PLL_LOCK0 shown before the time 410 may be a logical low value (e.g., disabled). The portion 406b of the signal PLL_LOCK0 shown after the time 410 may be a logical high value (e.g., enabled).

The decision windows 404a-404c may each last a particular number of clock cycles. In the example shown, the decision windows 404a-404c may each be 2000 clock cycles. Without implementing the circuit 100, the decision windows 404a-404c may be selected to be sufficiently long enough to reliably detect the lock. Without the circuit 100 a lock detection circuit may count additional clock cycles when the signals are far from final locking. The signal PLL_LOCK0 may be enabled (e.g., indicating a final locking) when the signal VCTRL0 is locked for an entire one of the decision windows 404a-404c.

In the example shown, the portion 402a of the signal VCTRL0 may be far away from locking during the decision window 404a. The portion 402b of the signal VCTRL0 may be locked during the decision window 404b around the time 408 (e.g., PLL_LOCKED). However, since the signal PLL_LOCK0 may not be enabled until the signal VCTRL0 is locked for an entire one of the decision windows 404a-404c, an additional decision window 404c may be needed. The signal PLL_LOCK0 is not shown as enabled (e.g., the portion 406a is shown as a logical low) until around the time 410 at the end of the decision window 404c (e.g., the portion 406b is shown as a logical high).

In the timing diagram 400', a portion 402a' and a portion 402b' of the signal VCTRL (e.g., described in association with FIG. 2) are shown, a (phase detect) window 420 is shown, a (decision) window 422 is shown and a portion 406a' and a portion 406b' of a signal (e.g., PLL_LOCK) are shown. A line 424 is shown. The line 424 may represent a time when '0's are detected by the phase comparator circuit 102. A line 426 is shown. The line 426 may represent a time when the signal VCTRL is locked (e.g., PLL_LOCKED). For example, the phase comparator circuit 102 may detect 16 consecutive '0's between the time 424 and the time 426. A line 428 is shown. The line 428 may represent a time when the signal PLL_LOCK is enabled. The signal VCTRL in the timing diagram 400' is shown having the same timing values as the signal VCTRL0 in the timing diagram 400. The portion 406a' of the signal PLL_LOCK shown before the time 428 may be a logical low value (e.g., disabled). The portion 406b' of the signal PLL_LOCK shown after around the time 428 may be a logical high value (e.g., enabled).

The phase detect window 420 may represent the time before the phase comparator circuit 102 generates the signal ENABLE. The signal ENABLE from the phase comparator 102 may start the digital-type counter-based lock detector (DLD) circuit 104 when the frequency of the signal CKFB (e.g., based on the signal CKOUT) is close enough to the reference frequency CKREF (e.g., the signal VCTRL may be close to locking). By waiting until the signal VCTRL is close to locking, the circuit 104 may skip the clock cycles when far away from final locking. The circuit 104 may implement the decision window 422 for determining the lock status. The decision window 422 may start when the signal ENABLE is active. The lock status may be determined during the decision window 422 based on a number of pulses of the reference signal CKREF. The lock status may be determined when the signal ENABLE is active.

The decision window 422 may be based on a number of pulses of the reference clock signal CKREF. In the example shown, the decision window 422 may be 144 clock cycles. The number of clock cycles implemented in the decision window 422 may be a pre-selected value. Decreasing the number of clock cycles implemented in the decision window 422 may improve a lock time. Increasing the number of clock cycles implemented in the decision window 422 may improve a locking accuracy. In an example, selecting 144 clock cycles for the decision window 422 may be a trade-off between locking accuracy and lock time. Implementing the phase comparator circuit 102 may allow the number of clock cycles implemented in the decision window 422 to be reduced compared to conventional locking circuits (e.g., a conventional locking circuit may achieve very low locking accuracy with only 144 clock cycles). The number of clock cycles implemented in the decision window 422 may be varied according to the design criteria of a particular implementation.

The signal VCTRL may be almost locked around the time 426 (e.g., the phase comparator 102 may generate the signal ENABLE). The circuit 104 may initiate the decision window 422. The circuit 104 may count 144 cycles based on the reference clock before deciding whether the signal VCTRL is in lock or not. If the signal VCTRL is locked, the signal PLL_LOCK may be enabled. In some embodiments, the output of the circuit 104 may cut off the clock inputs into the phase comparator 102 (e.g., as described in association with FIG. 3). If the signal VCTRL is not locked, then the circuit 104 may count another 144 cycles to decide on the lock status (e.g., initiate another one of the decision windows 422). For example, the decision window 422 may be repeated periodically until the signal PLL_LOCK is generated or the signal ENABLE is not active. By implementing the circuit 100, a small decision window (e.g., 144 clock cycles) is used.

In the example shown, the portion 402a' of the signal VCTRL may be far from locking until around the time 424. The phase comparator circuit 102 may determine the pre-determined threshold of logical values (e.g., 16 consecutive logical low values) between the time 424 and the time 426. The portion 402b' of the signal VCTRL may be close to locking around the time 426. Since the time 426 is before the decision window 422, the portion 402b' of the signal VCTRL is locked for the entire time of the decision window 422. The portion 406a' of the signal PLL_LOCK may be disabled (e.g., logical low) until around the time 428. The portion 406b' of the signal PLL_LOCK may be enabled (e.g., logical high) around the time 428, which corresponds to the end of the decision window 422. Compared to the example timing diagram 400 without implementing the circuit 100, the timing diagram 400' enables the signal PLL_LOCK earlier by implementing the circuit 100.

The various signals of the present invention are generally "on" (e.g., a digital HIGH, a logical high value, or '1') or "off" (e.g., a digital LOW, a logical low value, or '0'). However, the particular polarities of the on (e.g., asserted) and off (e.g., de-asserted) states of the signals may be adjusted (e.g., reversed) to meet the design criteria of a particular implementation. Additionally, inverters may be added to change a particular polarity of the signals.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

Although embodiments of the invention have been described in the context of a DDR4 application, the present invention is not limited to DDR4 applications, but may also be applied in other high data rate digital communication applications where different transmission line effects, cross-coupling effects, traveling wave distortions, phase changes, impedance mismatches and/or line imbalances may exist. The present invention addresses concerns related to high speed communications, flexible clocking structures, specified command sets and lossy transmission lines. Future generations of DDR can be expected to provide increasing speed, more flexibility, additional commands and different propagation characteristics. The present invention may also be applicable to memory systems implemented in compliance with either existing (legacy) memory specifications or future memory specifications.

While the invention has been particularly shown and described with reference to embodiments thereof, it will be understood by those skilled in the art that various changes in form and details may be made without departing from the scope of the invention.

The invention claimed is:

1. An apparatus comprising:
an analog circuit configured to generate an enable signal in response to (i) a first comparison of a width of an up pulse and a pre-determined width and (ii) a second comparison of a width of a down pulse and said pre-determined width, wherein (a) said up pulse and said down pulse are generated in response to a comparison of a feedback signal and a reference signal and (b) said enable signal is active when both said first comparison and said second comparison are within a pre-determined threshold; and
a digital circuit configured to generate an output signal representing a lock status between (i) said feedback signal and (ii) said reference signal, wherein (A) said lock status is determined (a) during a decision window based on a number of pulses of said reference signal and (b) when said enable signal is active, and (B) said decision window is repeated periodically until said enable signal is not active.

2. The apparatus according to claim 1, wherein said decision window starts after said enable signal is active.

3. The apparatus according to claim 1, wherein said pre-determined threshold comprises a determination of a consecutive number of logical values corresponding to said width of said up pulse and said width of said down pulse.

4. The apparatus according to claim 3, wherein (i) said logical values corresponding to said width of said up pulse are determined based on a filtering of said up pulse and (ii) said logical values corresponding to said width of said down pulse are determined based on a filtering of said down pulse.

5. The apparatus according to claim 1, wherein said analog circuit implements a phase comparator.

6. The apparatus according to claim 5, wherein said phase comparator comprises a shift sampling register.

7. The apparatus according to claim 6, wherein said shift sampling register is implemented to remove meta-stability.

8. The apparatus according to claim 6, wherein said shift sampling register is implemented to determine a consecutive number of logical values.

9. The apparatus according to claim 6, wherein (i) said shift sampling register implements a 24-bit shift sampling register, (ii) a first eight stages of said 24-bit shift sampling register removes meta-stability and (iii) a last sixteen stages of said 24-bit shift sampling register determines whether there have been sixteen consecutive logical zero values.

10. The apparatus according to claim 6, wherein said shift sampling register comprises a plurality of flip-flop circuits configured in series.

11. The apparatus according to claim 5, wherein said phase comparator comprises a pulse sampling circuit configured to filter at least one of (a) said up pulse and (b) said down pulse.

12. The apparatus according to claim 1, wherein said digital circuit implements a lock detector.

13. The apparatus according to claim 1, wherein said decision window comprises 144 clock cycles.

14. The apparatus according to claim 1, wherein said pre-determined width corresponds to 400 ps.

15. The apparatus according to claim 1, wherein said apparatus is implemented in a memory.

16. The apparatus according to claim 1, wherein said apparatus comprises a fast-response hybrid lock detector in a phase-locked loop.

17. The apparatus according to claim 1, wherein (i) said up pulse is generated when said feedback signal is lower than said reference signal and (ii) said down pulse is generated when said feedback signal is higher than said reference signal.

18. An apparatus comprising:
an analog circuit configured to generate an enable signal in response to (i) a first comparison of a width of an up pulse and a pre-determined width and (ii) a second comparison of a width of a down pulse and said pre-determined width, wherein (a) said up pulse and said down pulse are generated in response to a comparison of a feedback signal and a reference signal and (b) said enable signal is active when both said first comparison and said second comparison are within a pre-determined threshold; and
a digital circuit configured to generate an output signal representing a lock status between (i) said feedback signal and (ii) said reference signal, wherein (A) said lock status is determined (a) during a decision window based on a number of pulses of said reference signal and (b) when said enable signal is active and (B) said output signal is presented to logic gates configured to disable said analog circuit when said output signal is active.

19. An apparatus comprising:
an analog circuit configured to generate an enable signal in response to (i) a first comparison of a width of an up pulse and a pre-determined width and (ii) a second comparison of a width of a down pulse and said pre-determined width, wherein (a) said up pulse and said down pulse are generated in response to a comparison of a feedback signal and a reference signal and (b) said enable signal is active when both said first comparison and said second comparison are within a pre-determined threshold; and
a digital circuit configured to generate an output signal representing a lock status between (i) said feedback signal and (ii) said reference signal, wherein (A) said lock status is determined (a) during a decision window based on a number of pulses of said reference signal and (b) when said enable signal is active and (B) said analog circuit is configured to enable said digital circuit to skip counting clock cycles when said feedback signal and said reference signal are far from final locking.

* * * * *